310-334 SR
10/12/82 OR 4,354,132

United States Patent [19]

Borburgh et al.

[11] 4,354,132

[45] Oct. 12, 1982

[54] ULTRASONIC TRANSDUCER WITH A PLASTIC PIEZOELECTRIC RECEIVING LAYER AND A NON PLASTIC TRANSMITTING LAYER

[75] Inventors: Jacques Borburgh, Poxdorf; Ingmar Feigt, Erlangen, both of Fed. Rep. of Germany

[73] Assignee: Siemens Aktiengesellschaft, Berlin & Munich, Fed. Rep. of Germany

[21] Appl. No.: 125,371

[22] Filed: Feb. 28, 1980

[30] Foreign Application Priority Data

Apr. 6, 1979 [DE] Fed. Rep. of Germany ....... 2914031

[51] Int. Cl.³ ............ H01L 41/08

[52] U.S. Cl. ............ 310/334; 310/800; 310/336

[58] Field of Search ............ 310/334, 335, 336, 338, 310/327, 800; 357/26, 45; 73/624, 625, 628, 629, 632, 641; 128/660, 663

[56] References Cited

U.S. PATENT DOCUMENTS 2,625,035 1/1953 Firestone ............ 73/632 X
2,875,354 2/1959 Harris ............ 310/336 X
4,217,684 8/1980 Brisken et al. ............ 310/334 X

FOREIGN PATENT DOCUMENTS 1278520 9/1968 Fed. Rep. of Germany .

OTHER PUBLICATIONS

"Monolithic Silicon-$PVF_2$ Piezoelectric Arrays for Ultrasonic Imaging" by R. G. Swartz et al., 8th Int. Symp. on Acoustic Imaging, Key Biscayne, Fla. 5-2-9-78 pp. 1-27.

Experimental Broadband Ultrasonic Transducers Using $PVF_2$ Piezoelectric Film, *Electronics Letters,* Aug. 5, 1976, vol. 12, #16, pp. 393, 394.

*Electro-Technology,* Feb. 1970, vol. 85, Pamphlet 2.

*Primary Examiner*—Mark O. Budd

*Attorney, Agent, or Firm*—Hill, Van Santen, Steadman, Chiara & Simpson

[57] ABSTRACT

In exemplary embodiments, a transmitting layer of material having a relatively high dielectric constant and high acoustic impedance, and a receiving layer of material having a relatively low dielectric constant and low acoustic impedance are superimposed such that an optimum construction is provided which simultaneously creates optimum results for the instance of transmission and reception. The two layers are interconnected by means of hybrid techniques such that they mate in a laminar manner.

15 Claims, 2 Drawing Figures

ULTRASONIC TRANSDUCER WITH A PLASTIC PIEZOELECTRIC RECEIVING LAYER AND A NON PLASTIC TRANSMITTING LAYER

SUMMARY OF THE INVENTION

The present invention relates to an ulrasonic transducer.

According to the present invention, there is provided an ultrasonic transducer comprising a transmitting layer comprising material having a relatively high dielectric constant and a relatively high acoustic impedance, and a receiving layer comprising material having a relatively low dielectric constant and a relatively low acoustic impedance, wherein the layers are interconnected by means of hybrid techniques in a laminar manner.

The receiving layer could provide a matching layer for the instance of transmission. In this case, the receiving layer could be formed for matching body tissue or water.

The receiving layer could be mounted, preferably by adhesion, on the transmitting layer with the interposition of contact means, for example in the form of a thin contact layer or printed tracks provided by means of printed circuit techniques. The contact means could have an electrical connection for a receiving circuit.

The surface of the receiving layer which is remote from the transmitting layer could have an electrical connection; and the transmitting layer could have, on the surface which is remote from the receiving layer, an electrical connection for a transmitter circuit.

Component parts of a receiving circuit, such as a receiver amplifier, could be incorporated in an integrated circuit type of construction sandwiched between the transmitting and receiving layers.

The transmitting layer and the receiving layer could be mounted, preferably by means of hybrid techniques, on a carrier body which is preferably elastic, for example comprising rubber or the like.

The present invention will now be described by way of example with reference to the accompanying drawing sheet; other objects, features and advantages will be apparent from this detailed disclosure and from the appended claims.

DETAILED DESCRIPTION

Figure 1:
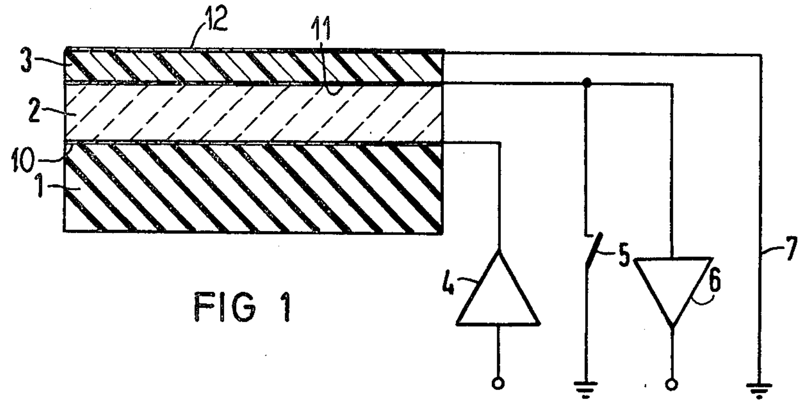
FIG. 1 shows a cross section through one example of an ultrasonic transducer.

In FIG. 1, an ultrasonic transducer comprises, in a sandwich manner of construction, a carrier body 1 with a transmitting layer 2 and a receiving layer 3. The layers 2 and 3 are interconnected by means of hybrid techniques with the larger surfaces of one beneath the larger surfaces of the other. A material having a relatively high dielectric constant and a relatively high acoustic impedance, for example a piezoelectric ceramic material, is used for the transmitting layer 2. In this connection, preferably the transmitting layer comprises lead-zirconate-titanate or lead-metaniobate. In contrast, the receiving layer 3 comprises a material having a relatively low dielectric constant and a relatively low acoustic impedance. It serves simultaneously as a matching layer for the instance of transmission. In this connection, piezoelectric films of plastic material (e.g. a synthetic polymer) with an impedance of approximately $3.10^6$ Pascal/meter (Pas/m) and a Q-factor of approximately 15 are preferably provided. Polyvinyl difluoride ($PVF_2$) is a favored material for the piezoelectric plastic films serving as the receiving layer 3. In place of this material, films of polyvinyl chloride or of polycarbonate could be used. The carried body 1 could consist of epoxy resin. However, elastic rubber could instead be used as a suitable "backing" material in this connection, so that in conjunction with the elastic piezoelectric plastic films and suitably divided piezoelectric ceramic material, an elastic transducer construction capable of being joined closely is possible.

The transmitting layer 2 and the receiving layer 3 are mounted on the carried body 1 by means of hybrid techniques. The transmitting layer 2 has, on the surface which is remote from the receiving layer 3, an electrical connection contact or electrode means 10 for a transmitter amplifier 4. Electrical high-frequency pulses are thus supplied via this transmitter amplifier 4 to the transmitting layer 2 for exciting the transmitting layer 2 for the purpose of emitting ultrasonic pulses. There is interposed between the receiving layer 3 and the transmitting layer 2 electrical contact means or electrode means 11, for example a thin contact layer or conductive tracks provided by means of printed circuit techniques, which provides an electrical receiving connection for a receiver amplifier 6 for echo pulses which are received by the receiving layer 3. A switch 5 is disposed in parallel with the receiver amplifier 6, with which, at the instance of transmission, the receiver amplifier 6 can be short-circuited. In this case, there is ground potential at the electrode means 11, between the transmitting layer 2 and the receiving layer 3. Finally, the receiving layer 3 also has an electrical connection 7 for supplying ground potential to electrode means 12 on the surface which is remote from the transmitting layer 2.

Figure 2:
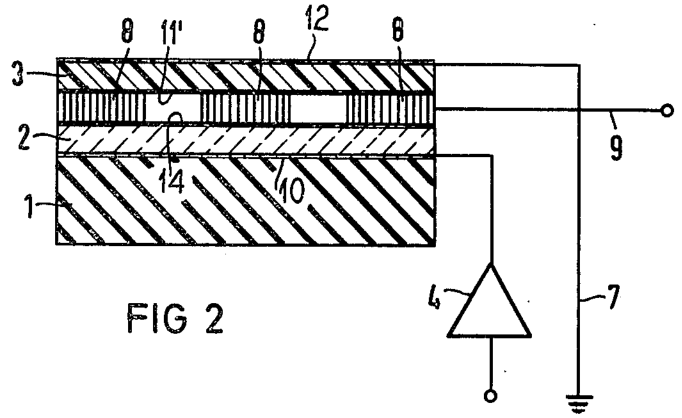
FIG. 2 shows a cross section through another example of an ultrasonic transducer.

FIG. 2 shows a modification of the transducer of FIG. 1. This transducer, as in that of FIG. 1, again comprises a carrier body 1, a transmitting layer 2 and a receiving layer 3 with electrode means 10 and 12, constructed using hybrid techniques. In comparison with the transducer of FIG. 1, however, component parts 8 of a receiving circuit, more particularly a receiver amplifier, are incorporated in an integrated circuit type of construction between the transmitting layer 2 and the receiving layer 3 in a sandwich method of construction. An electrode means indicated at 11' may be coupled with the input of receiver amplifier 8. This results in a particularly compact type of construction. Electrical connection with the output of the component parts 8 between the transmitting layer 2 and the receiving layer 3 takes place via a signal line 9. An electrode means may be provided at 14, if desired, for selective grounding by means of a switch such as 5, FIG. 1, at the instant of transmission. Such layers 11' and 14 would be insulated from the semiconductor material forming components 8.

The ultrasonic transducers shown only in cross section in FIGS. 1 and 2 are preferably each in the form of a cuboid. Arrays of transducers could be used, for example transducer arrays having the individual elements arranged in the form of a matrix. The form of the entire arrangement can again be optionally in the form of a cuboid or even round or the like. Correspondingly, arrays of transducers with a fine division of the individual elements could be used.

It will be apparent that many modifications and variations may be effected without departing from the scope of the novel concepts and teachings of the present invention.

The following is included by way of explanation of the background of the invention and to identify publications disclosing exemplary hybrid techniques and integrated circuit techniques for implementing the illustrated embodiments. Such publications are also incorporated herein by reference, by way of background.

The invention relates to an ultrasonic transducer comprising a transmitting layer of material having a relatively high dielectric constant and high acoustic impedance, and a receiving layer of material having a relatively low dielectric constant and low acoustic impedance.

For conventional ultrasonic transducers, for example even such in array form which have a plurality of individual transducer elements arranged side by side, short pulse excitation with a great depth of penetration is required, more particularly for use in medicine. At the same time however, pulse processing which corresponds to the original also acquires increasing significance in the instance of reception, for example in the case of tissue identification, etc. Conventional ultrasonic transducers use one signal piezoelectric material at the same time as transmitter and receiver. The requirments set are obtainable here only with a relatively high degree of technological effort, for example fine division of the individual transducer in the case of the array construction. Attempts have already been made to improve more particularly the instance of reception. Thus, for example, in place of piezoelectric material layers of polyvinylidene difluoride ($PVF_2$) were used for transmitting and receiving. An ultrasonic transducer of this type is, for example, the subject of the article "EXPERIMENTAL BROADBAND ULTRASONIC TRANSDUCERS USING $PVF_2$ PIEZOELECTRIC FILM" in the journal "ELECTRONICS LETTERS", 5th August 1976, Vol. 12, No. 16, pages 393 and 394. It is true that this previously known transducer does improve the Q-factor of reception, yet at the same time it also impairs the instance of transmission since the release of energy during transmission is too slight owing to the low Q-factor of the $PVF_2$ layer which forms the transmitting layer. In order to create a somewhat better balance between instance of transmission and instance of reception a further proposal has already been put forward which was presented under the title "MONOLITHIC SILICON-$PVF_2$ PIEZOELECTRIC ARRAYS FOR ULTRASONIC IMAGING" by the authors R. G. Swartz and J. D. Plummer at the "Eighth International Symposium of Acoustic Imaging" in Key Biscayne, Florida between 29th May and 2nd June 1978. The so-called "Theta" array transducer described in this presentation material, more particularly on page 15, comprises an outer ring of piezoelectric ceramics, which serves as transmitter and inside which there is arranged a receiver array havng a large number of relatively small dimensions and comprising a layer of polyvinyl difluoride ($PVF_2$). The spacially separated arrangement of transmitting- and receiving layers has the disadvantage that it lacks compactness, an unfavourable transmitting/receiving ratio again still resulting therefrom.

The object of the present invention is to construct an ultrasonic transducer of the type initially referred to, to the effect that with a construction which has optimum compactness optimum results for the instance of transmission and reception are simultaneously created.

The object is achieved according to the invention in that the two layers are interconnected by means of hybrid techniques such that they mate in a laminar manner.

The invention thus allows the transducer to be constructed in an extremely compact manner. At the same time, the requirements in the instance of transmission and reception are taken into account in an optimum manner.

The invention can be developed in a particularly advantageous arrangement to the effect that the receiving layer is at the same time matching layer for the instance of transmission. By using the receiver simultaneously as matching layer, the construction is further simplified; furthermore, short pulse excitations can be handled particularly successfully hereby. The receiving layer should, constructed as matching layer, be constructed to match body tissue or, when a water stretch is inserted therebetween, to match water.

The ultrasonic transducers shown only in a cross section in FIGS. 1 and 2 are preferably in the form of a cuboid in this case. Arrays in this form are shown, for example, in FIGS. 1 and 2 of German Auslegeschrift No. 26 28 492. Of course, transducer arrays having different forms can also be used, for example transducer arrays having the individual elements arranged in the form of a matrix; the laminar form of the entire arrangement can again be optionally in the form of a cuboid or even round or the like. Correspondingly, ultrasonic arrays with fine division of the individual elements can also be used.

We claim as our invention:

1. An ultrasonic transducer comprising a transmitting layer comprising piezoelectric material having a relatively high dielectric constant and a relatively high acoustic impedance, a receiving layer comprising piezoelectric material having a relatively low dielectric constant and a relatively low acoustic impedance, wherein the layers are interconnected in a laminar manner, and support means having the transmitting layer adjacent thereto and having the receiving layer in front of the transmitting layer such that acoustic waves generated by the transmitting layer are transmitted to body tissue under examination via the receiving layer, said receiving layer comprising a piezoelectric plastic film having an inner electrode means located between the transmitting layer and the receiving layer and having an outer electrode means at the front of the receiving layer, said receiving layer having an acoustic impedance which is relatively close to the acoustic impedance of body tissue in comparison to the acoustic impedance of said transmitting layer, and the transmitting layer having an acoustic impedance which is relatively high in comparison to the acoustic impedance of body tissue.

2. A transducer according to claim 1, wherein the receiving layer is mounted by adhesion on the transmitting layer.

3. A transducer according to claim 1, wherein printed tracks provided by means of printed circuit techniques are interposed between the transmitting and the receiving layer.

4. A transducer according to claim 1, wherein a receiving circuit is electrically connected with said inner electrode means (11').

5. A transducer according to claim 1, wherein the surface of the receiving layer which is remote from the transmitting layer has said outer electrode means (12) thereon.

6. A transducer according to claim 1, wherein the transmitting layer has, on the surface which is remote from the receiving layer, an electrical connection means (10), and a transmitter circuit connected with said electrical connection means (10).

7. A transducer according to claim 1, wherein component parts of a receiving circuit are incorporated in an integrated circuit type of construction sandwiched between the transmitting and receiving layers.

8. A transducer according to claim 7, wherein the receiving circuit comprises a receiver amplifier.

9. A transducer according to claim 1, wherein the transmitting layer comprises piezoelectric ceramic material and the receiving layer comprises piezoelectric synthetic plastics film.

10. A transducer according to claim 9, wherein the receiving layer comprises piezoelectric synthetic plastics film with an impedance of approximately $3.10^6$ Pas/m and a Q-factor of approximately 15.

11. A transducer according to claim 9, wherein the transmitting layer comprises lead-zircontate-titanate or lead-metaniobate.

12. A transducer according to claim 9, wherein the receiving layer comprises piezoelectric synthetic plastics film comprising polyvinyl difluoride ($PVF_2$).

13. A transducer according to claim 1, wherein the receiving layer and the transmitting layer are mounted on the support means by means of hybrid techniques.

14. A transducer according to claim 1, wherein the support means is elastic.

15. A transducer according to claim 14, wherein the carrier body comprises rubber or the like.

* * * * *